SEMICONDUCTOR DEVICE

Original Filed Jan. 29, 1963 2 Sheets-Sheet 1

INVENTOR.
John C. Haenichen

BY Mueller & Aichele

ATTY'S.

SEMICONDUCTOR DEVICE

INVENTOR.
John C. Haenichen
BY
Mueller & Aichele
ATTY'S.

United States Patent Office
3,473,979
Patented Oct. 21, 1969

3,473,979

SEMICONDUCTOR DEVICE

John C. Haenichen, Scottsdale, Ariz., assignor to Motorola, Inc., Chicago, Ill., a corporation of Illinois Original application Jan. 29, 1963, Ser. No. 254,651. Divided and this application Jan. 3, 1967, Ser. No. 646,763
Int. Cl. H01l 7/50, 7/46, 5/00
U.S. Cl. 148—187 4 Claims

ABSTRACT OF THE DISCLOSURE

A method for forming a high frequency transistor forming the emitter-base and collector-base junctions by diffusions through the same hole in the device oxide coating. The first diffusion is in a reducing atmosphere. The base is formed by diffusing through the hole into and through the collector region below the coating; then the emitter is diffused into the base forming a narrow base region between parallel junctions.

This is a division of application Ser. No. 254,561, filed Jan. 29, 1963, now abandoned.

This invention relates in general to semiconductor devices and more particularly to the manufacture of high frequency planar transistors.

High frequency transistors present a number of problems in manufacture in that the active semiconductor element of a typical high frequency transistor requires an extremely small geometrical configuration to operate properly. This is due to the low capacitances that must be attained in order to have a satisfactory high frequency device.

A high frequency transistor should not only be able to perform as required in the frequency range for which it was designed but obviously from a manufacturing viewpoint it should be an easy device to make and should be a high yield device, that is, one which has a design and a manufacturing process such that the percentage of reject devices in production is small. Unfortunately, many of the characteristics desired in high frequency transistors have been more or less mutually exclusive in that operational requirements frequently tended to make the devices harder to make and to reduce the production yield. Generally, for a particular transistor type, i.e., mesa, planar, etc., manufacturing problems are more numerous and difficult as higher frequency devices are designed. Many of these problems revolve about the fact that the active regions of high frequency transistors are extremely small and therefore more care must be exercised in processing. Typically, the dimensions of the active regions of these devices are smaller than the tolerances on the dimensions of the more accurate components of a fine watch, and therefore the margin for error in locating one region of the transistor relative to another, attaching leads, etching materials away, forming junctions, etc., is very small.

Good high frequency characteristics in a transistor would require at least that the device have a narrow base width, small junction capacitances, and a low base resistance. However, as the base widths become narrower in the conventional transistor, the base resistance of the device tends to be rather high due to the resulting decrease in the base cross section. In an attempt to decrease the collector capacitance of the devices, higher resistivity base material and also high resistivity collector regions are employed toward this end. Both of these approaches have problems associated with them. The obvious one, in the case of the high resistivity base material is that the base resistance is also increased and in the case of the collector region, this increases the series resistance of the collector which is undesirable in most transistors regardless of their operating frequency. The emitter resistance should also be low. The higher resistivity base and collector regions also tend to cause the gain of the transistor to vary with the current flowing through it.

In the case of planar transistors, especially high frequency planar transistors, there are a number of critical registrations or alignments of the semiconductor material relative to certain photolithographic tools which are used in fabricating these devices. These registrations are more difficult as the devices become smaller. The margin for error is especially small in cases where several dependent registrations must be made as the errors in this case are cumulative.

In addition to the uual problems involved in the fabrication of high frequency transistors, those high frequency transistors employed in integrated circuitry are somewhat more difficult to fabricate because some of the connections to the contacts of the transistor are frequently awkward to make. It would be desirable in most integrated circuits if all of the connections to a transistor could be made from a single surface as is presently possible only in planar transistor structures; usually the silicon substrate has only two major surfaces and one of these is most often entirely used in bonding the substrate to some object such as a header.

Accordingly, one of the objects of this invention is to provide a high frequency transistor that can be manufactured simply but will still meet the necessary requirements of having a narrow base width, low collector capacitance, low base resistance and low series emitter and collector resistance.

Another object of this invention is to provide a method for fabricating high frequency transistors having an improved geometrical design that are easier to manufacture with high yields and with the consequent low cost.

A feature of this invention is the method of selectively diffusing both a base region and an emitter region through the same opening in the silicon dioxide or glass diffusion masks to improve the degree of control of device geometry and reduce the number of photolithographic operations.

In accordance with this invention, high frequency transistors of an excellent type may be fabricated utilizing two selective diffusions through the same opening in the diffusion masking material, thereby creating a device which satisfies a number of requirements which are critical in high frequency transistors. The two diffusions through this same opening in the oxide are the base diffusion and emitter diffusion.

Figures 1, 2, 3, 4, 5, 6, 7:
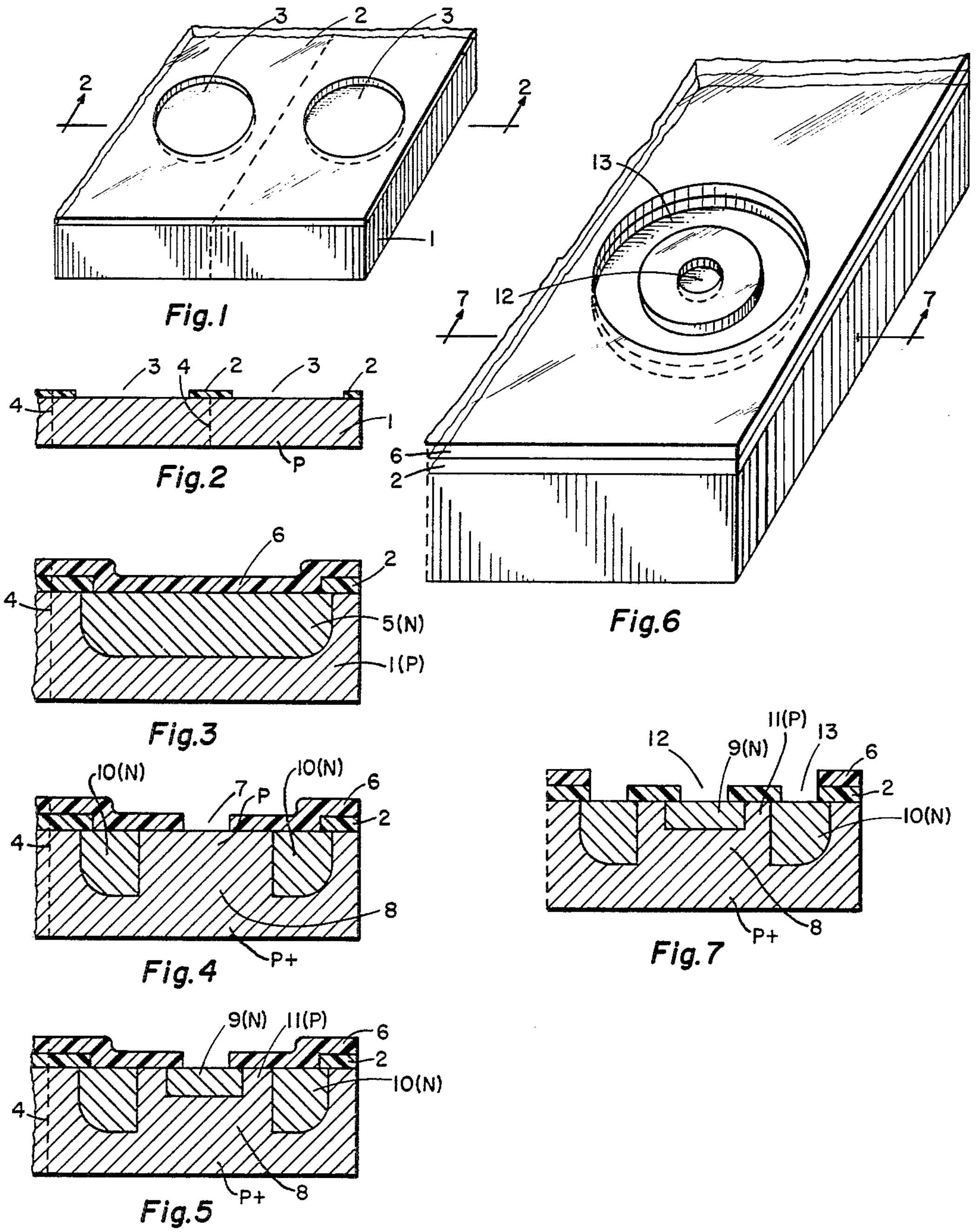
FIG. 1 shows a portion of a silicon dioxide coated wafer of P-type silicon with holes etched in the silicon dioxide for selective diffusion process.
FIG. 2 shows a cross section of the wafer of FIG. 1.
FIG. 3 shows in cross section one-half of the same wafer as shown in FIG. 2, but following a solid state diffusion of N impurity into the wafer through the open regions of the silicon dioxide.
FIG. 4 is another cross sectional view of the same portion of the wafer with a hole etched in the region of the glass film which was formed during the diffusion of the N impurity in the silicon and after a P-type diffusion through the hole in the oxide has been completed.
FIG. 5 shows the same cross sectional view after an N diffusion has been selectively performed through the same hole in the oxide.
FIG. 6 shows an isometric view of the device after openings in the silicon dioxide have been prepared for metallizing the collector and emitter.
FIG. 7 shows a sectional view of FIG. 6 taken along line 7—7.

The accompanying drawings and the following text detail the invention. FIG. 1 is an isometric drawing of a wafer of P-type silicon 1 upon which a layer of silicon dioxide 2 has been grown and a number of holes 3 for selective diffusion purposes have been etched in the silicon dioxide. In FIG. 2 a sectional view through the wafer has been taken along line 2—2 to show the same structure more clearly. The silicon dioxide 2 will mask against a subsequent diffusion of arsenic impurity, which is a relatively slow diffusant, into the silicon. The dashed lines 4 indicate where the wafer will be cut or otherwise separated into individual semiconductor units. Diffusion masking materials such as silicon dioxide are shown only on the upper surface of the transistor in order to simplify the drawings. However, it should be understood that in practice all regions of the transistor that are not to be diffused are coated with silicon dioxide or other suitable material.

FIG. 3 shows the structure after the diffusion through the hole has been made. This diffusion formed an N-type region 5, and, as is apparent, a film 6 was formed as a part of the diffusion processing. This is a silicon dioxide film formed by oxidizing the hot silicon by exposure to water vapor during the arsenic diffusion. The oxide material has properties such that will inhibit the diffusion of boron impurities into the underlying silicon and it will be used as a diffusion mask against boron. The techniques mentioned in this paragraph are well-known in the art.

FIG. 4 shows a cross sectional view of the same region of the wafer as in FIG. 1 but after a new hole 7 has been etched into the silicon dioxide which now covers the previously existing holes. This hole 7 is shown approximately concentric with the original hole 3 in the silicon dioxide 2. A boron diffusion has been made and the boron has been selectively diffused through the hole 7 and has created a P region 8 extending from the surface of the wafer through the N material and to the original P material. Note that no silicon dioxide or glass film is shown covering the surface of the silicon within the hole 7. This is to point out that care is taken in this case to use diffusion techniques which minimize silicon dioxdie or glass formation on the silicon surface at this point. If a borosilicate glass is used as the P-type impurity source, it must be kept thin enough that it is ineffective as a diffusion mask against a subsequent N-type diffusion.

FIG. 5 shows the same cross section as before except that an N diffusion to form the N-type emitter 9 and establish the thickness of the base 11 has been performed selectively through the hole 7 in the phosphosilicate glass. The N material that is used in this case is a fast diffusant in silicon such as phosphorus in order that the collector and base diffusions are not appreciably altered by the time and temperatures involved in this emitter diffusion.

FIG. 6, an isometric view, and FIG. 7, a sectional view, show the additional regions of silicon dioxide 12 and 13 that have been removed at the surface of the device so that metal contacts may be applied to these inner and outer N regions of the transistor; the outer N region is the collector 10 of this transistor and is annular and is shown concentric with the emitter 9 and the spreading region 11 of the base.

Figure 8:
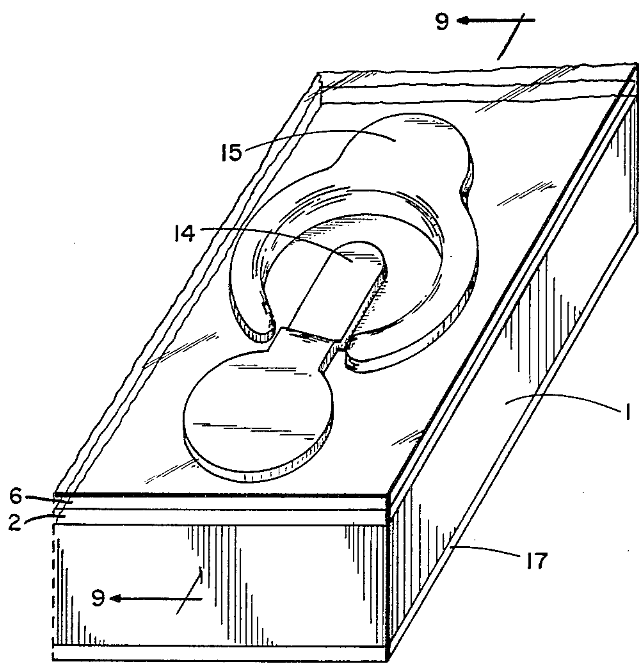
FIG. 8 shows an isometric view of the device of FIG. 6 after the collector, emitter and base contacts have been placed on the transistor.
Figure 9:
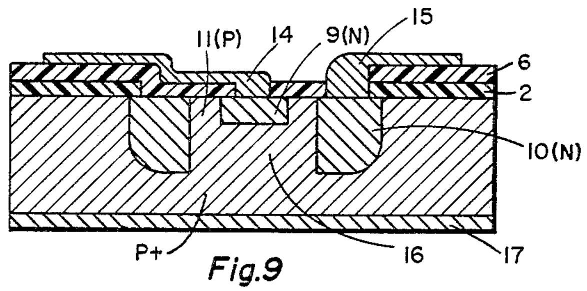
FIG. 9 shows a sectional view of FIG. 8 taken along line 9—9.

The collector and emitter regions of the device are metallized by high vacuum evaporation techniques to form contacts as shown in FIG. 8 and FIG. 9. The metallization is done on the transistor so that the metal emitter and collector contacts 14 and 15 extend onto the insulating film of silicon dioxide 6 in order to provide a larger contact region. The vacuum evaporations for both emitter and collector metallizing may be done at the one time without added steps. Aluminum is used for these emitter 14 and collector 15 contacts. The cross section in FIG. 9 shows the relative position of the constituent parts of the device. Note that the spreading region 11 of the total base region is also annular since this region lies in the cylindrical portion of the device between the emitter 9 and collector 10. This base region has a low resistance as it has a very large section 16 leading to the more active portion of the base lying between the outer region of the outer wall of the emitter cylinder and the inner wall of the collector cylinder. The region of the base between the emitter and the collector is usually of an intermediate resistivity so that the breakdown voltage is high and the collector capacitance is low, but obviously the transistor base resistance may be kept very low without reducing the resistivity of this region by having a very low resistivity P region between this base region and the metal base contact 17 at the bottom of the device. The upper region of the transistor die in which the collector, base and emitter diffusions are accomplished should then be a P region with a $P^+$ region lying underneath. The $P^+$ region may be formed by diffusion on a P wafer, or alternatively a P region may be epitaxially grown on a $P^+$ wafer of silicon. The base contact 17 of gallium doped gold substantially covers the bottom of the $P^+$ region.

Because of the fact that the emitter and collector regions may be metallized substantially at the regions where maximum transistor action is taking place, the device tends to have very low emitter and collector series resistances. There is additional collector capacitance due to some extraneous collector surface, but due to the construction of the device the non-critical portions of the base outside of the base cylinder 11 but near the collector may be made of relatively high resistivity bulk material to form there a wider depletion region and thus reduce this collector capacitance without appreciably affecting the resistance of the base, the most active portion of which is the diffused cylinder 11. This is done, in fact, so that low collector capacitances are maintained without any significant increase in the base resistance of the device.

After metallizing the device is mounted to a conventional transistor header (not shown) in much the same way as the conventional planar or mesa type of transistor except that where normally a collector connection to a header is made by alloying or soldering the collector to the header structure, in this device it is the base portion that is so attached, the base contact rather than the collector being at the bottom of the die as is usual in the more conventional planar or mesa devices. The base lead of the header is connected to the base portion of the header rather than the usual collector lead of the header. This is a decided advantage if the transistor is employed with the base grounded, which is the usual way in high frequency applications since this provides the highest gain with the least noise. This eliminates the usual wire connection between the header and the base contact thus reducing the inductance of the transistor, and as a result the value of the maximum frequency at which the device may be operated is increased. Thermocompression bonding, customarily used for making connection to metallize contacts on the smaller planar and mesa devices, is used for wire attachment using aluminum wire to the emitter and collector of this device.

When used for integrated circuits the basic transistor structure as described is very conveniently made in a slightly different way on an integrated circuit substrate of silicon. Rather than doing an N-type collector diffusion initially, a base region is selectively diffused first through a disk-shaped hole in a silicon dioxide film on the substrate. This is a P diffusion using borosilicate glass as a diffusion source. A hole is etched in the borosilicate glass which has a masking action against the diffusion of phosphorus and then the diffusion of phosphorus for forming the N-type collector is made. The steps for making this device from this point are exactly as in the previous device. The final device structure has concentric base, collector and emitter contacts at the surface of the substrate where it is easy to make connection to them and thus is ideal for integrated circuits where much of the circuit is at the surface of the silicon substrate.

Only conventional fabrication techniques are required for fabricating these devices and the basic diffusion technique required for this device is the well-known one of selective diffusion which is simply the use of silicon dioxide and certain glasses which are used as masks against the diffusion by a certain impurity. The base region is metallized by evaporating on gold which is alloyed to the silicon after the wafers have been cut into individual transistor units or dice. In this operation, a die is placed on a gold plated transistor header made of Kovar or an equivalent material and heated above the gold-silicon eutectic temperature. This accomplishes the alloyed contact to the silicon as well as the bond of the semiconductor die to the transistor header. The emitter and collector of the device are very small so the well-known "over-metallization" technique is used to make contact to them. Aluminum is evaporated onto exposed or bare regions of the emitter and collector silicon and is also allowed to extend over onto the silicon dioxide to form larger contact areas. The aluminum is very active and aided by the heating of the silicon wafer it chemically bonds to the silicon dioxide as well as makes alloyed contact to the silicon of the emitter and collector where the silicon dioxide was removed. The concentrations of N impurity at the emitter and collector is made sufficiently high during the diffusions so that PN junctions are not formed by the aluminum.

The base width control for this device is exceptional because the same diffusion mask is used both for the base and the emitter diffusion. The base diffusion, of course, is such that the periphery of the hole in the silicon dioxide determines the location of the collecting surface which is largely the inside diameter of the collector cylinder. The emitter being diffused through the same hole has its cylindrical emitting surface referenced exactly to the collector surface. Obviously, since the same hole in the mask of glass and silicon dioxide is used for both diffusions, any local errors in the shape of the hole will reproduce in both diffusions so that the effect of irregularities is not nearly so pronounced. Where normally an irregularity in a diffusion mask might produce a lateral spike-like portion extending close to the collector of the device, this is not so adverse in the present transistor since the same irregularity is produced in the collector junction as well, so that the separation between the two opposed regions at the irregularity tends to be about the same as at the regions of the junctions at the more even edges of the hole in the glass.

While the structures shown in the drawings have cylindrical geometries, it should be obvious from the previous paragraph that cylindrical geometries are not essential to the use of the method of this invention. The hole through which the emitter and base region and the collector, for that matter, are diffused might readily be of a square, star-shaped or any other desirable geometry since the general relationship of the emitter to the collector junctions tends to be preserved with this system. It should also be clear that the invention described is not limited to the fabrication of NPN devices since by using appropriate materials, PNP devices may be made in a similar manner.

Figure 10:
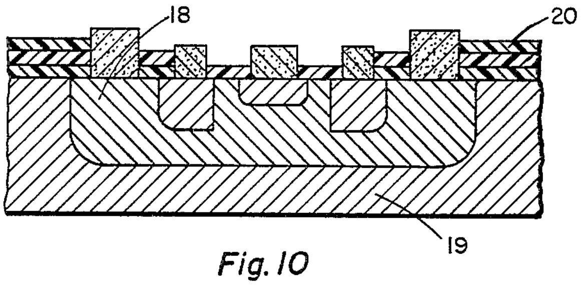
FIG. 10 shows a design of a similar device in cross section except it is adapted for integrated circuitry purposes on a silicon substrate.

The basic device described herein is well suited for integrated circuitry since emitter, base and collector contracts may all be at one surface as desired. FIG. 10 represents the device when fabricated on an isolated base region 18 on a substrate 19 of high resistivity silicon. The base region in this case was formed by selective diffusion and the transistor is electrically isolated by the high resistivity of the substrate 19. An additional diffusion masking film of glass or silicon dioxide 20 is represented due to the extra selective diffusion step in forming the base region in the substrate.

A typical NPN device fabricated according to this invention would have an initial film of silicon dioxide of about 10,000 angstrom units thick. The oxide film during the selective arsenic diffusion is grown to a thickness of about 5000 angstrom units thick since it has a masking function for the subsequent collector diffusion. The diffusion N-type collector region would have a surface concentration of about $10^{20}$ atoms per cubic centimeter after compensation of the previously P doped material. A wafer of about 5 mils thickness would have a collector cylinder of about 3.6 mils OD and an ID of about 0.6 mil and would be about 3 microns in depth. The emitter cylinder which is concentric with the collector cylinder would be of about 0.55 mil diameter and would have a depth of about 2 microns. The emitter would have a surface concentration of N-type impurity atoms of $5 \times 10^{20}$ atoms per cubic centimeter after compensation of P-type atoms. The base resistance at the surface as a result of the base diffusion and measured prior to the emitter diffusion would have a sheet resistance of about 100 ohms per square. When borosilicate glass is used as an impurity source for the base diffusion it covers the opening provided in the oxide for both base and emitter diffusions, so it is usually kept less than 500 angstrom units thick in order that it is largely ineffective in masking against the subsequent phosphorus emitter diffusion. The upper or epitaxial portion of the base which would have an initial resistivity of 0.5 ohm-centimeter while the lower region of the die, also P-type, on which the epitaxial region was grown would have initially a resistivity of 0.01 ohm-centimeter.

The following values are typical of the electrical constants of this device. It has a base resistance of about 20 ohms, a collector capacitance of about 1.0 picofarads. It has resistance for the collector of about 30 ohms and a series resistance for the emitter of about 3 ohms. A device of about these approximate characteristics is a good high frequency amplifier up to frequencies of about $10^9$ cycles per second.

Transistors according to this invention are improved in many respects over present passivated transistors without sacrifice of their more desirable characteristics. Specific reference is made to the fact that the character of the junctions of these present passivated devices have been improved and preserved by films of glass or silicon dioxide where these junctions are in contact with the sensitive outer surfaces of the transistor element. This invention retains these protective passivating features of the passivated devices and so that transistors made according to it have the low reverse currents, low noise and the good stability associated with such features.

As is apparent, this is a superior method for making high frequency transistors and one which gives high yields at no increase in cost and additionally is readily adaptable for integrated circuit use as well.

What is claimed is:

1. A method of making transistor devices which comprises, forming a masking coating on a surface of a semiconductor body of one conductivity type with an opening extending through said coating to a surface of said body, diffusing an impurity into said body through said opening to convert the material in a selected region of said body to the opposite conductivity type, forming a second masking coating on said body over said selected region, opening a hole in said second masking coating smaller in lateral extent than said selected region, diffusing an impurity into said body through said hole and entirely through said selected region to reconvert the material beneath said hole to the original conductivity type so that the unconverted portion of said selected region constitutes an annular collector, and diffusing an impurity through said hole into a portion only of said reconverted material to form an emitter within said annular collector so that the bulk of said body constitutes a transistor base, the most active part of which lies between said emitter and said collector.

2. A method of making semiconductor devices which comprises, forming a masking coating on a surface of a semiconductor element, forming an opening in said masking coating to expose semiconductor material at the surface within said opening, diffusing an impurity into said semiconductor element through said opening to form a first PN junction beneath said opening which extends to said surface of said element under said masking coating, forming a second masking coating on said element and within said opening, forming a second opening in said second masking coating with and smaller than the first-mentioned opening, diffusing an impurity into said semiconductor element through said second opening to a depth greater than said first junction so as to extend the inner part of said first junction to the surface of said element under said second masking coating, diffusing another impurity through said second opening to form a second PN junction beneath said second opening and extending to said surface under said second coating, said second junction having a peripheral portion with a configuration which matches the inner portion of said first junction as a result of forming said junctions by successive diffusions through the same opening in said second masking coating.

3. A method for making semiconductor devices which comprises, providing a semiconductor element having first and second zones of opposite conductivity type with a PN junction between said zones, forming an adherent coating of a material through which impurities do not readily diffuse on the surface of said semiconductor element, forming an opening in said coating to a central portion of one of asid zones of said element, said opening being smaller in area than the underlying zone, diffusing an impurity into said element through said opening and entirely through the central portion of said one zone to extend an inner part of said junction to said surface under said coating, diffusing another impurity through the same opening in said coating to form a junction beneath said opening which extends to said surface of said element under said coating and which has a peripheral portion the configuration of which closely matches the configuration of the inner part of said first-mentioned junction.

4. A method of making semiconductor devices which comprises, forming a masking coating on a surface of a semiconductor element of N-type material, forming an opening in said masking coating to expose semiconductor material at the surface within said opening, diffusing an acceptor impurity into said semiconductor element through said opening to form a P-type region beneath said opening and a PN junction which extends to said surface of said element under said masking coating, forming a second masking coating on said element which covers said opening, forming a second opening in said second masking coating within and substantially smaller than the first-mentioned opening, diffusing a donor impurity into said semicoductor element through said second opening and to a depth greater than said first PN junction so as to form an N-type region which extends through said P-type region to the original N-type material of said semiconductor element, thereby extending said first junction to the surface of said element under said second masking coating, and diffusing an acceptor impurity through said second opening to form a P-type region under said second opening and a second PN junction extending to said surface under said second masking coating, thereby providing a transistor structure in which the junctions are in alignment as a result of the successive diffusions through the same opening in said second masking coating.

References Cited

UNITED STATES PATENTS

| | | | |
|---|---|---|---|
| 2,954,307 | 9/1960 | Shockley | 148—187 |
| 3,183,128 | 5/1965 | Leistiko et al. | 148—187 |
| 3,212,162 | 10/1965 | Moore | 148—186 |
| 3,223,904 | 12/1965 | Warner et al. | 148—186 |

L. DEWAYNE RUTLEDGE, Primary Examiner

R. A. LESTER, Assistant Examiner

U.S. Cl. X.R.

148—188, 189; 29—578